(12) United States Patent
Gabato, Jr. et al.

(10) Patent No.: US 7,786,772 B2
(45) Date of Patent: Aug. 31, 2010

(54) METHOD AND APPARATUS FOR REDUCING SPURS IN A FRACTIONAL-N SYNTHESIZER

(75) Inventors: Manuel P. Gabato, Jr., Elmhurst, IL (US); John J. Bozeki, Elgin, IL (US); Joseph A. Charaska, Melrose Park, IL (US); Paul H. Gailus, Prospect Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 143 days.

(21) Appl. No.: 12/131,035

(22) Filed: May 30, 2008

(65) Prior Publication Data

US 2009/0295435 A1 Dec. 3, 2009

(51) Int. Cl.
*H03L 7/06* (2006.01)

(52) U.S. Cl. .......................... 327/156; 327/157; 375/376

(58) Field of Classification Search .................. 327/156, 327/157; 375/376
See application file for complete search history.

(56) References Cited

U.S. PATENT DOCUMENTS

| 4,204,174 | A | | 5/1980 | King | |
|---|---|---|---|---|---|
| 5,651,035 | A | * | 7/1997 | Tozun et al. | 375/373 |
| 5,900,755 | A | * | 5/1999 | Toeppen et al. | 327/163 |
| 6,046,646 | A | * | 4/2000 | Lo et al. | 331/10 |
| 6,160,861 | A | | 12/2000 | McCollough | |
| 6,294,936 | B1 | * | 9/2001 | Clementi | 327/156 |
| 6,670,854 | B2 | * | 12/2003 | Takeda et al. | 331/1 A |
| 6,731,667 | B1 | * | 5/2004 | Lee et al. | 375/130 |
| 6,975,148 | B2 | * | 12/2005 | Miyata et al. | 327/156 |
| 7,024,171 | B2 | * | 4/2006 | Gibbs | 455/260 |
| 7,271,666 | B1 | | 9/2007 | Melanson | |
| 7,394,885 | B2 | * | 7/2008 | Giunco et al. | 375/376 |
| 7,406,144 | B2 | * | 7/2008 | Wang | 375/376 |
| 2005/0275471 | A1 | | 12/2005 | Matsunami | |

FOREIGN PATENT DOCUMENTS

JP 2001-007700 A 1/2001

OTHER PUBLICATIONS

PCT/US2009/045372—European International Search Report—Written Opinion, mailed Jul. 30, 2009—15 pages.

* cited by examiner

*Primary Examiner*—Kenneth B. Wells
(74) *Attorney, Agent, or Firm*—Barbara R. Doutre

(57) ABSTRACT

A method and apparatus for reducing in-band spurs in a fractional-N synthesizer (100) includes generating a compensated current signal by a charge pump (108) coupled to a phase detector (106). The compensated current signal includes in-band spurs having frequencies within a frequency bandwidth associated with a loop filter (110). The method then includes selectively dithering the compensated current signal with a sufficient dither level to spread the frequencies of in-band spurs beyond the frequency bandwidth associated with the loop filter (110). The dithered compensated current signal is then passed through the loop filter (110) for filtering the in-band spurs having frequencies beyond the frequency bandwidth. The method then includes generating a voltage controlled oscillator (VCO) signal with reduced in-band spurs proportional to the filtered compensated current signal.

18 Claims, 5 Drawing Sheets

US 7,786,772 B2

METHOD AND APPARATUS FOR REDUCING SPURS IN A FRACTIONAL-N SYNTHESIZER

FIELD OF THE DISCLOSURE

The present disclosure relates generally to fractional-N synthesizers and more particularly to reducing spurs in fractional-N synthesizers.

BACKGROUND

Frequency synthesizers play a key role in a variety of technology industries. For example, frequency synthesizers are implemented in a variety of communication devices such as AM/FM radio, digital cellular phones, two-way subscribers, and spread spectrum transceivers, to name a few. In general, frequency synthesizers control the generation of local oscillator signals and the modulation of transmission signals in a wireless communication device. A frequency synthesizer is used to reliably produce frequencies that are derived from a reference frequency input source.

A fractional-N synthesizer produces output frequencies that are fractional multiples, i.e., integer plus fractional value, of a frequency derived from a reference input source. Fractional-N synthesizers may exhibit non-linear behavior resulting in the generation of undesirable spectral components in the vicinity of a VCO frequency signal, such as the presence of in-band spurs due to the non-linearities of synthesizer components such as but not limited to the phase detector and charge pump.

Thus, there is a need for a method and apparatus for reducing spurs in the fractional-N synthesizer to obtain a VCO frequency signal with reduced spurs.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
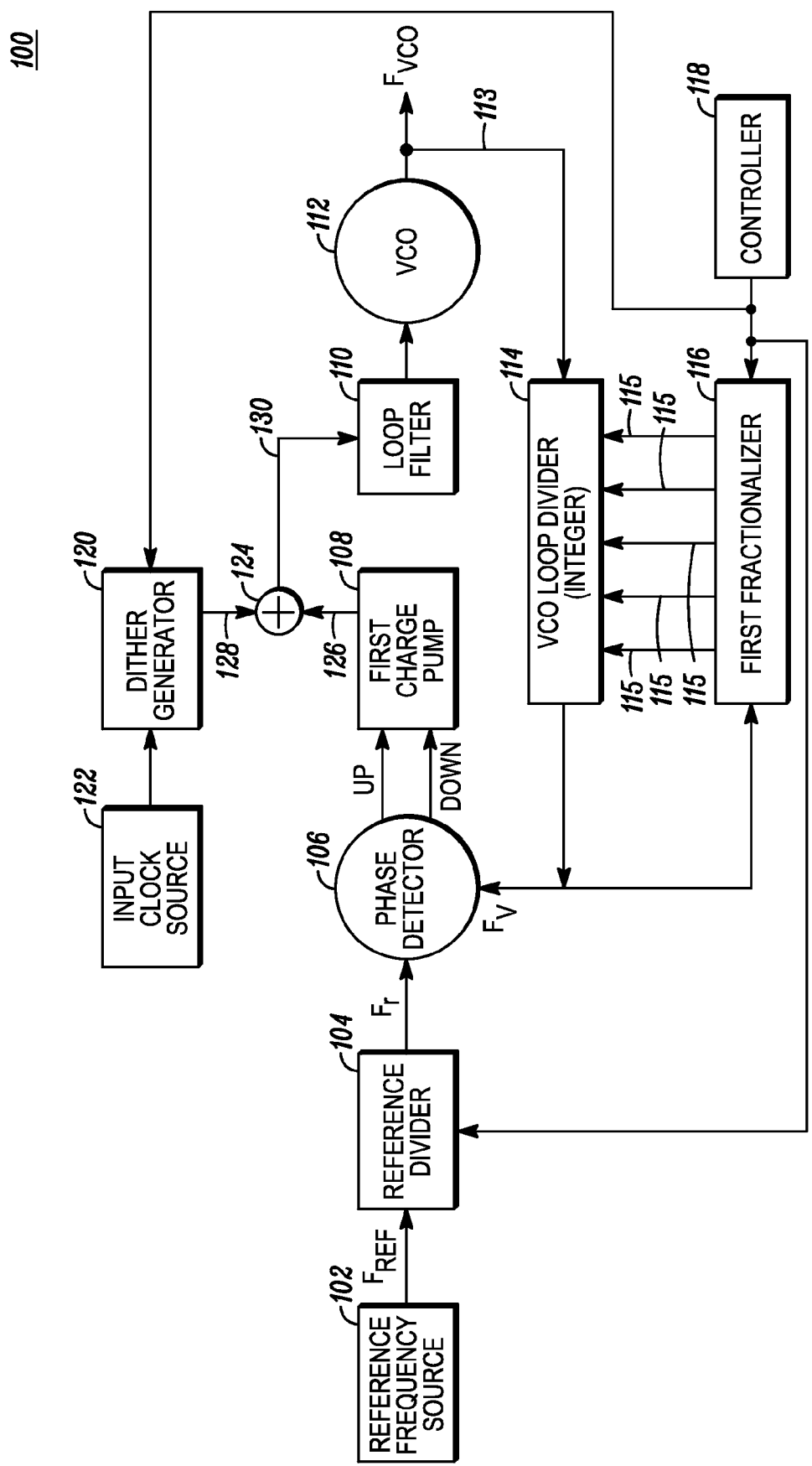
FIG. 1 is a block diagram of a fractional-N synthesizer in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Before describing any details, it should be observed that the embodiments reside primarily in an apparatus and method for reducing in-band spurs in a fractional-N synthesizer. Accordingly, the apparatus and method components have been represented where appropriate by conventional symbols in the drawings, showing only those specific details that are pertinent to understanding the embodiments so as not to obscure the disclosure with details that will be readily apparent to those of ordinary skill in the art having the benefit of this description.

Various embodiments are disclosed herein. For example, one method for reducing in-band spurs in a fractional-N synthesizer includes generating a compensated current signal by a charge pump coupled to a phase detector. The compensated current signal includes in-band spurs having frequencies within a frequency bandwidth associated with a loop filter. The method then includes selectively dithering the compensated current signal with a sufficient dither level to spread the energy of in-band spurs beyond the frequency bandwidth associated with the loop filter. The dithered compensated current signal is then passed through the loop filter for filtering the in-band spur energy that has spread beyond the frequency bandwidth of the loop filter. The method then includes generating a voltage controlled oscillator (VCO) signal with reduced in-band spurs proportional to the compensated current signal.

FIG. 1 is a block diagram of a fractional-N synthesizer in accordance with some embodiments. The fractional-N synthesizer 100 includes a reference frequency source 102, a reference divider 104, a phase detector 106, a first charge pump 108, a loop filter 110, a voltage controlled oscillator (VCO) 112, a VCO loop divider 114, a first fractionalizer 116, a controller 118, an input clock source 122, and a dither generator. In accordance with the present invention, the dither generator 120 produces a dither signal 128 that is combined at the summer 124 with a compensated current signal 126 received from the first charge pump 108 to produce a dithered compensated current signal 130 that spreads the in-band spur energy beyond the bandwidth of the loop filter 110. Further, the in-band spur energy that is spread beyond the bandwidth of the loop filter can be attenuated at the output of the loop filter 110.

In accordance with the embodiment, the reference frequency source 102 generates a reference frequency signal, $F_{ref}$. The generated reference frequency signal $F_{ref}$ is then divided at the reference divider 104 to produce a divided reference frequency signal, $F_r$. The phase detector 106 receives two inputs, a first input, the divided reference frequency signal, $F_r$, from the reference divider 104 and a second input, a divided VCO frequency signal, $F_v$, from the VCO loop divider 114. The phase detector 106 produces phase error signals corresponding to a phase difference between the divided reference frequency signal, $F_r$, and the divided VCO frequency signal, $F_v$.

The VCO loop divider 114 receives a VCO signal 113, from the VCO 112 and divides such received VCO signal based on the control signals 115 received from an output of the first fractionalizer 116. Control signals 115 represent a sequence of divide values composed of fractional and integer values.

In accordance with the embodiment, the phase detector 106 produces the phase error signals to the first charge pump 108 coupled therewith. The first charge pump 108 generates current pulses proportional to the phase error signals received from the phase detector 106. The current pulses are also known as a compensated current signal which is then applied to the control input of the VCO 112 via the loop filter 110 via the summer 124 to produce an output VCO signal whose frequency represents the minimum phase error between Fr and Fv. The compensated current signal may have undesired spectral components known as in-band spurs resulting from but not limited to nonlinearities in the phase detector and charge pump. These in-band spurs may cause interference with the neighboring channels and hence need to be reduced before being applied to the control input of the VCO 112.

To reduce such in-band spurs, a dither signal is added to the compensated current signal by a dither generator 120, at the summer 124, that selectively dithers the compensated current signal to produce a dithered compensated current signal with a sufficient dither level to spread the energy of the in-band spurs beyond the frequency bandwidth associated with the loop filter 110. The loop filter 110 then receives the dithered compensated current signal from the summer 124 and attenuates the in-band spur energy that has been spread to frequencies beyond the frequency bandwidth associated with the loop filter 110. The output of the loop filter 110 is a VCO control signal with reduced in-band spurs.

The VCO control signal with reduced in-band spurs is then fed into the VCO 112 that is coupled to the VCO loop divider 114 to time align the divided VCO frequency signal, $F_v$, to the divided reference frequency signal $F_r$. This feedback process continues until a substantially zero phase error is attained.

Figure 2:
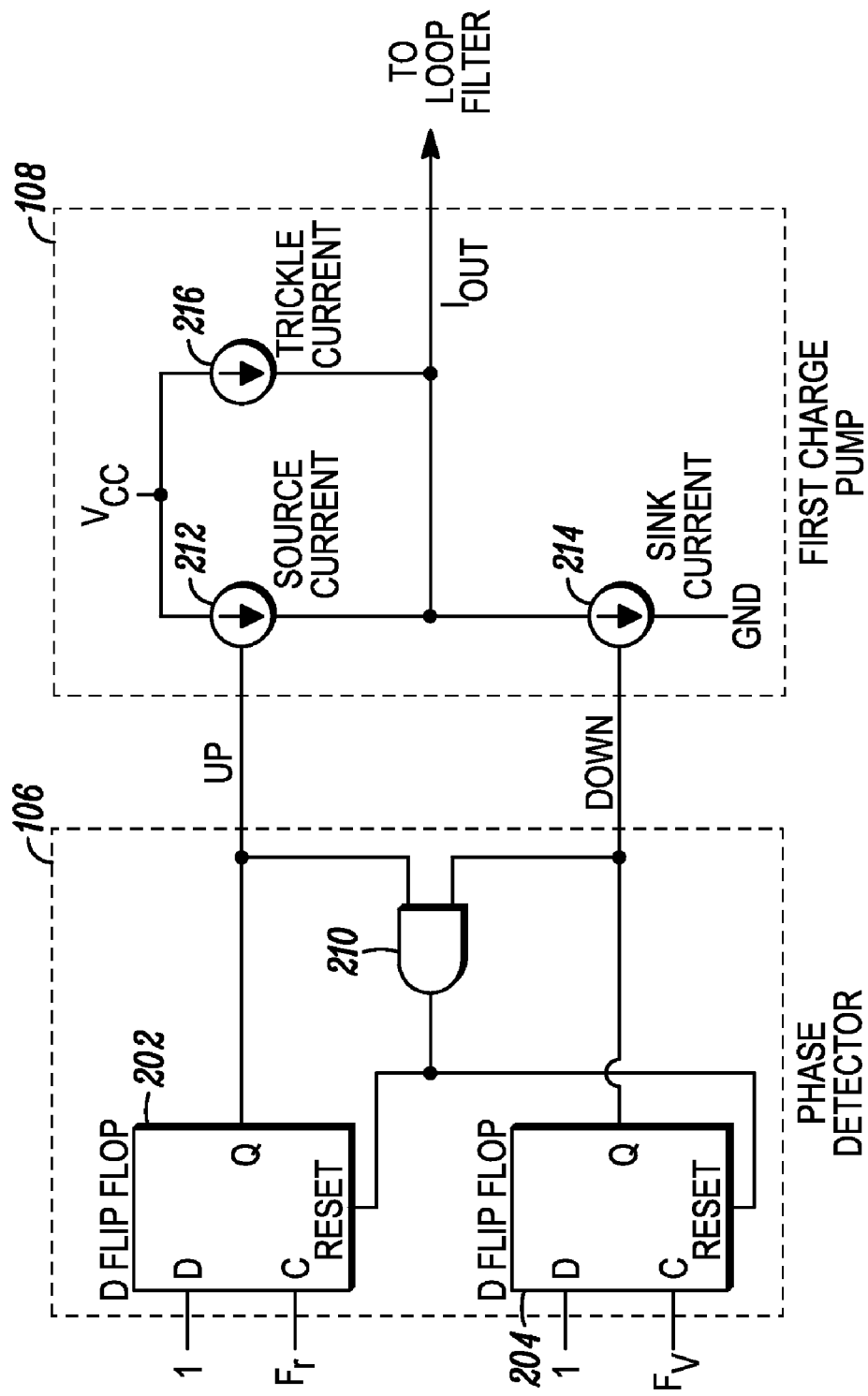
FIG. 2 is a schematic of a phase comparator and a first charge pump in accordance with some embodiments.

FIG. 2 is an example for schematics of phase detector 106 and a first charge pump 108 in accordance with some embodiments. It should be noted that the embodiments described herein may be comprised of any type of schematics or logical circuits, and are not limited to the schematics shown in FIG. 2. Further, it should also be noted that the schematics shown in FIG. 2 are considered as an example to understand the invention, and are not limited to the embodiments described herein. The phase detector 106 utilizes two D-type flip-flops and an AND gate for generating a phase error signal. The 'D' inputs to flip-flops 202, 204 are at logic high '1'. Flip-flop 202 receives its clock information from the divided reference frequency signal, $F_r$, and its Q output is an UP signal, which is then inputted to AND gate 210. The other input to AND gate 210 is provided by the Q output of flip-flop 204. Flip-flop 204 receives its clock from the divided VCO frequency signal, $F_v$, and its Q output is a DOWN signal. The output of AND gate 210 supplies the reset to both the flip-flops 202, 204.

In accordance with the embodiment, the phase detector 106 receives two inputs, a first input from the reference divider and the second input from the VCO loop divider and produces UP and DOWN signals corresponding to the phase error between Fr and Fv.

In accordance with the embodiment, the first charge pump 108 coupled to the phase detector 106 receives the UP signal and the DOWN signal as the phase error signals and accordingly generates current pulses to produce the compensated current signal that is proportional to the phase error signals received from the phase detector 106.

Figure 3:
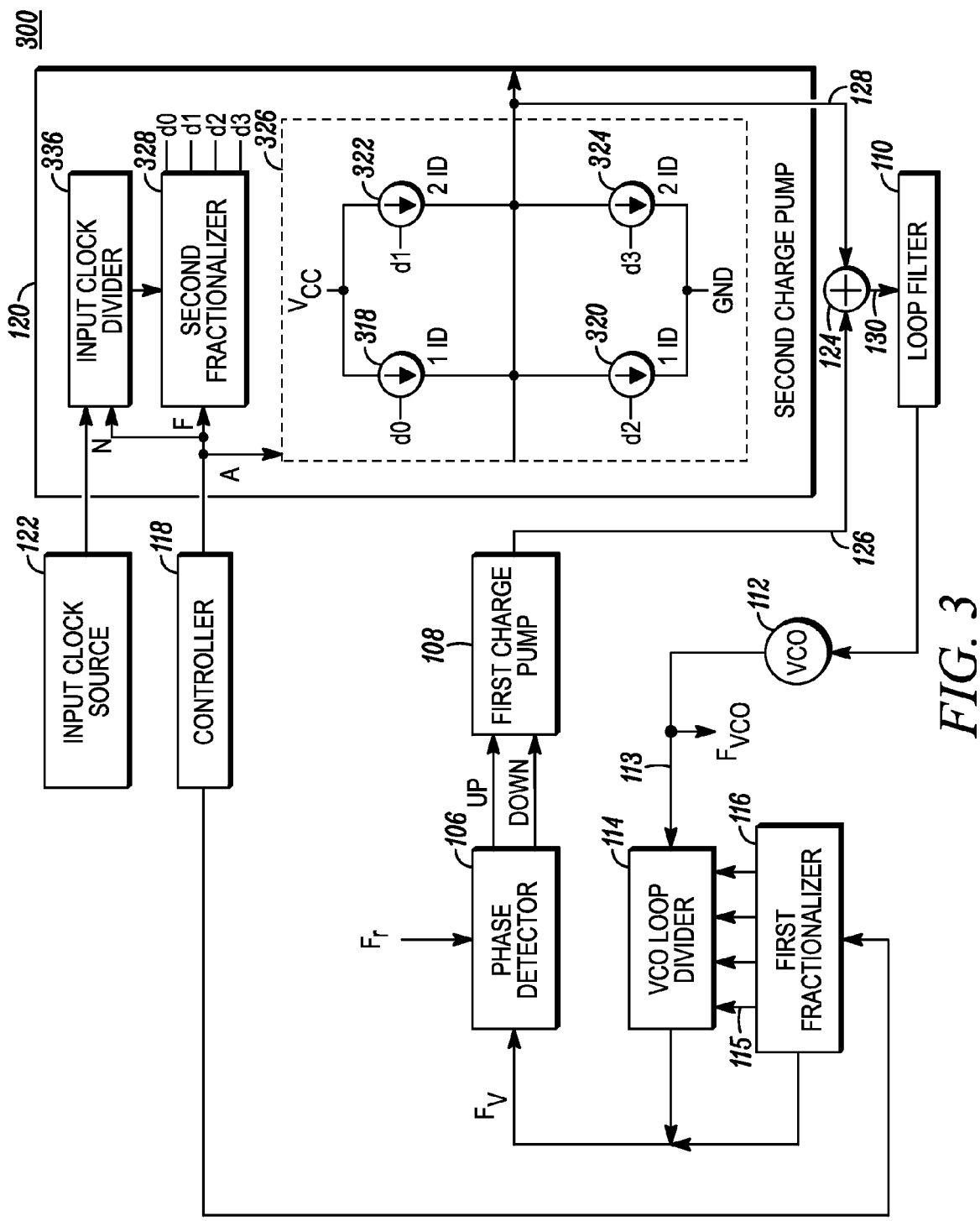
FIG. 3 is a schematic of a dither generator in accordance with some embodiments.

FIG. 3 is an example of schematics for a dither generator with other blocks of a fractional-N synthesizer in accordance with some embodiments. As described in FIG. 1 and FIG. 2, the first charge pump 108 provides the compensated current signal 126 to summer 124. In accordance with the embodiment, the dither generator is described in view of FIG. 3. The dither generator 120 includes a plurality of current switches 318, 320, 322, 324 as part of a second charge pump 326, an input clock divider 336, and a second fractionalizer 328 and selectively provides a dither current signal 128 to summer 124.

In accordance with an embodiment, the input clock divider 336 receives a clock frequency signal from an input clock source 122 and divides such clock frequency signal based on a divide ratio, N, received from the controller 118. The divided clock frequency signal is then fed to the second fractionalizer 328 along with a fractional value, F, of the controller 118. The second fractionalizer is different from the first fractionalizer and is positioned within the dither generator 120. The second fractionalizer 328 receives the divided clock frequency signal and produces a plurality of dither control signals d0, d1, d2, d3 based on the fractional value, F, received from the controller 118. The dither control signals d0, d1, d2, d3 are then applied to their respective current switches 318, 322, 320, 324 in the second charge pump 326. The second charge pump 326 produces a dither current signal based on the dither control signals d0, d1, d2, d3 received from the second fractionalizer 328. The second charge pump 326 also receives a value 'A', which is a programmable scale factor which modifies the magnitude of the dither currents in the second charge pump, from the controller 118. The dither control signals d0, d1, d2, d3 are applied to their respective current switches 318, 322, 320, 324 so as to produce the dither current signal. For example, a larger 'A' would correspond to larger dither current magnitude. The dither current signal is then added to the compensated current signal at summer 124 to spread the energy of the in-band spurs beyond the frequency bandwidth associated with the loop filter 110.

In one embodiment, the dither control signals d0, d1, d2, d3 are applied to their respective current switches 318, 320, 322, 324 to produce at least one magnitude of dither current. The at least one magnitude of dither current is then dynamically added to the compensated current signal to produce a dithered compensated current signal. The dithered compensated current signal is finally applied to the input of the loop filter 110.

In a further embodiment of FIG. 3, the second charge pump 326 can replace the trickle current 216 (shown in FIG. 2) of the first charge pump 108. In general, the trickle current 216 of the first charge pump 108 is a fixed fraction of the "source" current. Using the dither current generator 120 in place of the fixed trickle current 216 accomplishes two things: 1) precise control of the trickle current value and 2) spreading the in-band spur energy beyond the bandwidth of the loop filter where it can be attenuated. Briefly, the trickle current linearizes the phase detector 106 and improves performance. By integrating the trickle current (by changing 320 and 324 to sourcing currents and altering weighting factors d2 and d3, for example 320 could be 4D and 324 could be 8D) with the dither current generator, the amount of linearization can be controlled. As another example, each weighting factor d0, d1, d2, d3 could be one quarter of the source current. Other combinations of weighting factors can also be applied.

Figure 4:
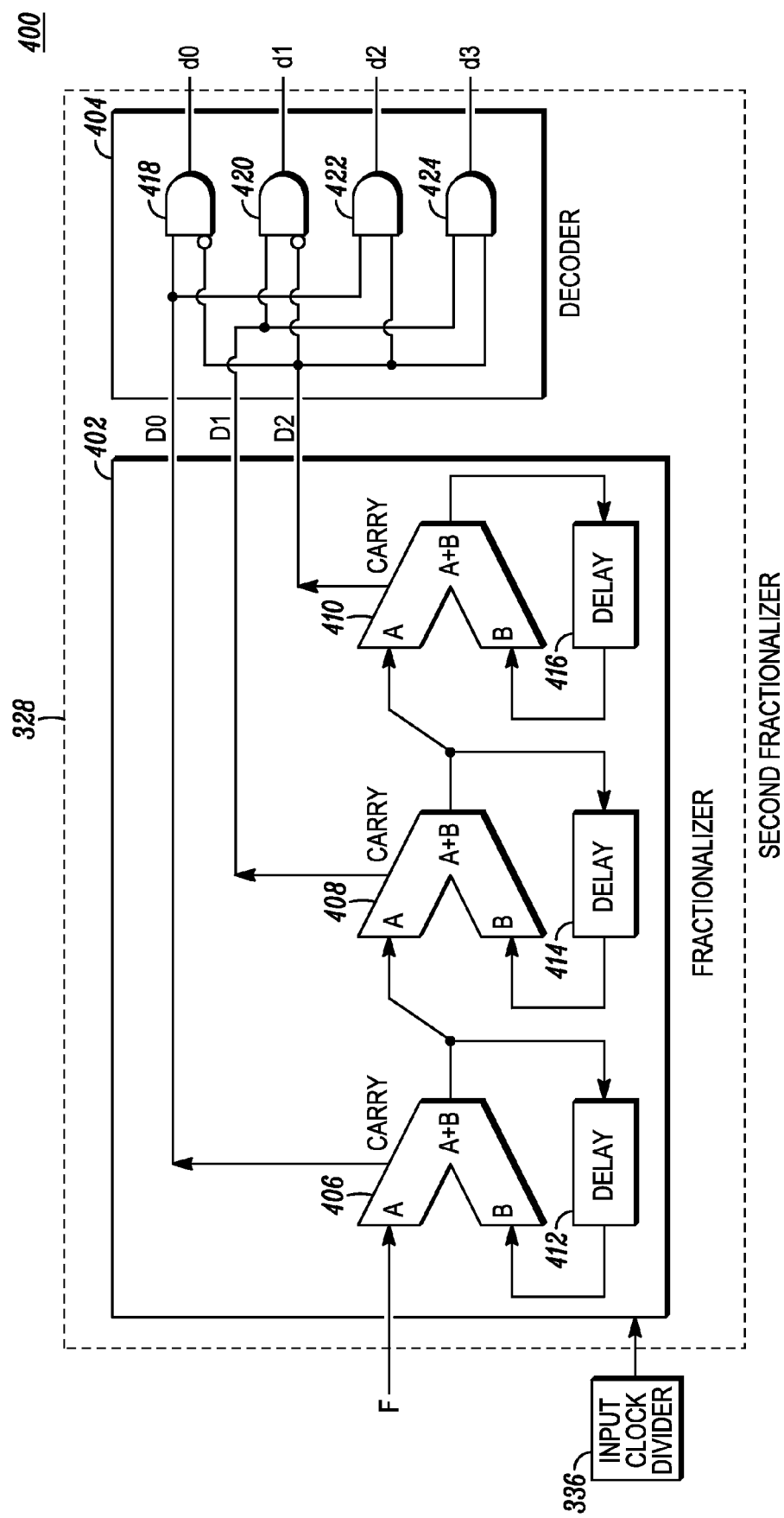
FIG. 4 is a schematic of a second fractionalizer in accordance with some embodiments.

FIG. 4 is an example of schematics for the second fractionalizer in accordance with some embodiments. The second fractionalizer 328 includes a fractionalizer 402 and a decoder 404. The fractionalizer 402 further includes a plurality of adders 406, 408, 410 and delay circuits 412, 414, 416. The fractionalizer 402 receives two inputs, a first input, the fractional value F, from the controller 118 and a second input, the divided clock frequency signal, from the input clock divider 336. The delay circuits 412, 414, 416 are provided in a feedback loop of their respective adders 406, 408, 410. Two outputs are obtained from each adder, a sum output and a carry output. The sum output of one adder is given as a first input to the next adder and as a second input to the same adder after a pre-determined delay provided by their respective delay circuit. For example, the output of adder 408 is given as the first input to the adder 410 and as a second input to the same adder 408 via the delay circuit 414. The carry output of the each of the adders is given as input to the decoder 404 coupled to the fractionalizer 402. The decoder 404 produces dither control signals d0, d1, d2, d3 at the output based on the combination of the carry outputs D0, D1, D2 obtained from the adders 406, 408, 410 of the fractionalizer 402. For example, if the input value of D0, D1, D2 is "000" then "d0" is selected as the dither control signal at the output of the decoder. Similarly, if the input value of D0, D1, D2 is "001" then "d1" is selected as the dither control signal. Thus, decoder produces at least four dither control signals d0, d1, d2, d3 based on the combination of inputs D0, D1, D2. The dither control signals are provided to their respective current switches of the second charge pump (shown in FIG. 3, 318, 322, 320, 324) for dithering the compensated current signal received from the first charge pump 108. It should be noted that the above described fractionalizer can be of any type of logical circuit, and are not limited to the aforementioned description.

Figure 5:
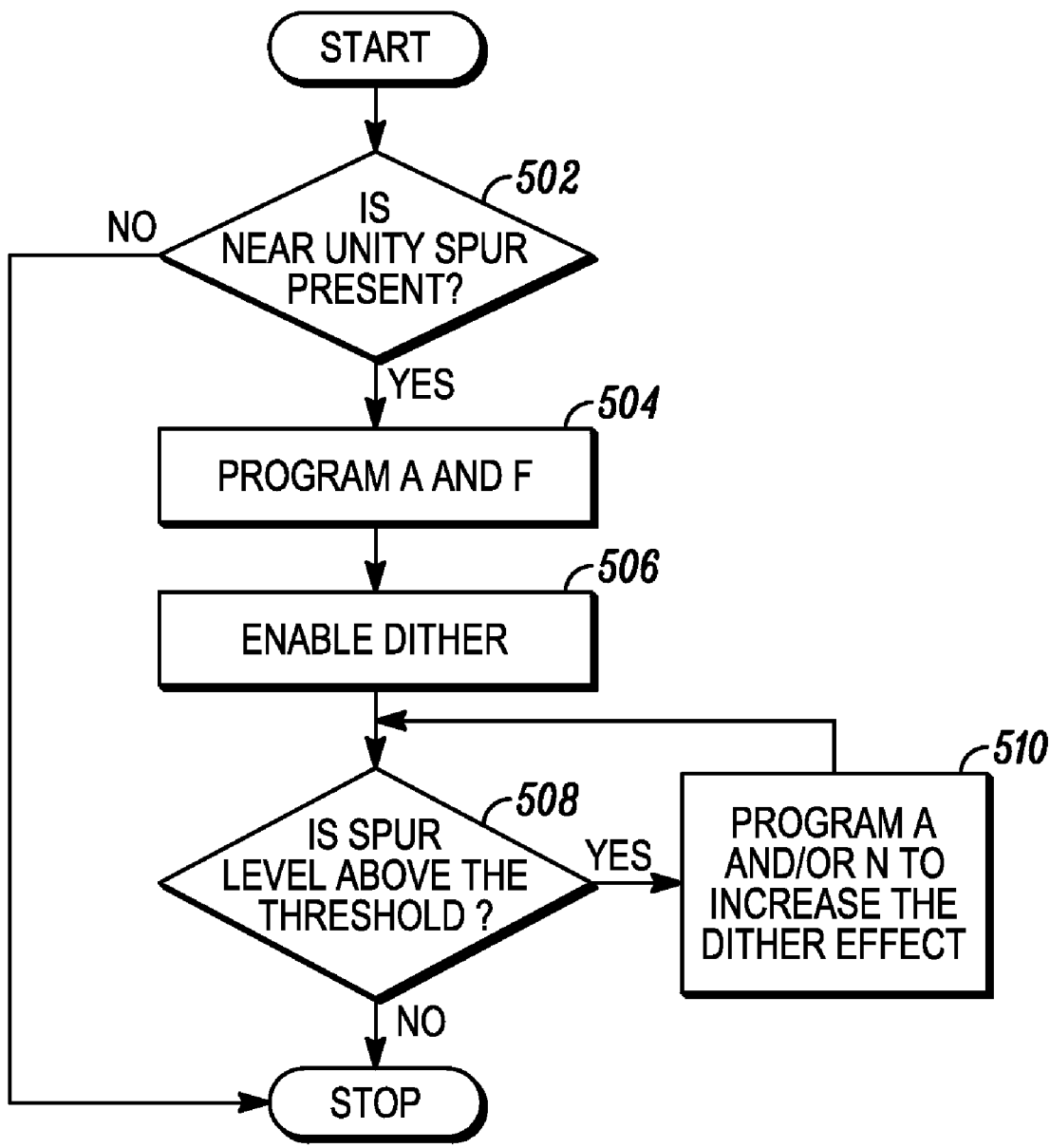
FIG. 5 is a flowchart of a method for reducing spurs in the fractional-N synthesizer in accordance with some embodiments.

FIG. 5 is a flowchart of a method 500 for reducing in-band spurs in the fractional-N synthesizer in accordance with some embodiments. In an embodiment, the method 500 is described in view of the block diagram shown in FIG. 1. The method starts with controller determining 502 whether in-band spurs are present in the VCO output signal. If the in-band spurs are present, the method continues with a step of adjusting 504 the fractional value, F, and the dither magnitude, A, which is provided to the dither generator. On the other hand, if the in-band spurs are not present, the method 500 ends.

Upon adjusting 504 the values, A and F, the method continues with a step of enabling 506 the dither generator to generate a dithered current signal proportional to the adjusted fractional value, F, and the dither magnitude, A. The compensated current signal is thus selectively dithered with a sufficient dither level to spread the energy of the in-band spurs beyond the frequency bandwidth associated with the loop filter so that the energy of the in-band spurs beyond the frequency bandwidth are attenuated or filtered when the dithered compensated current signal is passed through the loop filter. The method then continues to a step of determining 508 whether a level of in-band spurs is above a predetermined threshold. If the level of in-band spurs is above the predetermined threshold, the controller varies a divide ratio, N, and/or the dither magnitude, A, provided to the dither generator so that the magnitude of the dither current signal increases, thereby increasing the energy spreading effect of the dither current. The in-band energy is then attenuated or filtered when the dithered compensated current signal is passed through the loop filter. On the other hand, if the level of the in-band spurs is below or equal to the predetermined threshold, the method 500 ends.

Thus, the compensated current signal is dithered to spread the energy of in-band spurs beyond the frequency bandwidth associated with the loop filter such that the in-band spur energy in the VCO control signal is attenuated at the loop filter and a VCO output signal with reduced in-band spurs is produced at the output of VCO. The reduced in-band spurs are in-turn benefited in reducing interference in adjacent channels.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method for reducing in-band spurs in a fractional-N synthesizer, comprising:
   generating a compensated current signal having in-band spurs at frequencies within a predetermined frequency bandwidth;
   selectively dithering the compensated current signal with a sufficient dither level to spread the energy of in-band spurs beyond the frequency bandwidth associated with the loop filter, wherein selectively dithering the compensated current signal comprises dynamically adding at least one magnitude of current to the compensated current signal to produce the dithered compensated current signal by:
      generating at least one dither control signal proportional to a fractional value 'F' provided by a controller, the at least one dither control signal being generated based on a clock frequency signal divided by an input clock divider, wherein the clock frequency signal is divided at a divide ratio 'N' provided by the controller;
      providing the at least one dither control signal to at least one current source to produce the at least one magnitude of current; and
      dynamically adding the at least one magnitude of current to the compensated current signal;
   filtering the selectively dithered compensated current signal so as to attenuate remaining in-band spurs beyond the frequency bandwidth; and
   applying the filtered compensated current signal to a voltage controlled oscillator (VCO) so as to generate a VCO signal with reduced in-band spurs proportional to the compensated current signal.

2. The method of claim 1, wherein the compensated current signal is proportional to a phase error signal of the phase detector.

3. The method of claim 2, wherein the phase error signal is determined based on a phase difference between a divided reference frequency signal and a divided VCO frequency signal.

4. The method of claim 1, wherein the in-band spurs have energy at frequencies offset from the VCO signal considered to be in-band.

5. The method of claim 1, wherein filtering the in-band spurs comprises filtering only the energy of in-band spurs that are spread beyond the frequency bandwidth associated with the loop filter.

6. The method of claim 1, wherein the VCO signal is generated with reduced in-band spurs considered to be in-band of the VCO signal.

7. A synthesizer for a communication device, the synthesizer comprising:
   a first charge pump for generating a compensated current signal including in-band spurs within a frequency bandwidth associated with a loop filter;
   a dither generator coupled to the first charge pump and the loop filter, comprising:
      a second fractionalizer for generating at least one dither control signal based on a fractional value, F, received from a controller; and
      a second charge pump for selectively dithering the compensated current signal employing the at least one dither control signal to spread the energy of in-band spurs beyond the frequency bandwidth associated with the loop filter;
   the loop filter for attenuating the in-band spur energy associated with the dithered compensated current signal and providing a filtered signal with reduced in-band spurs to a voltage controlled oscillator (VCO); and
   wherein the controller determines that the frequencies of the in-band spurs are above a predetermined threshold in the dithered compensated current signal and varies a divided ratio 'N' to increase an amplitude of the dithered compensated current signal.

8. The synthesizer of claim 7 further comprising:
   a reference frequency source for generating and providing a reference frequency signal; and
   a reference divider coupled to the reference frequency source for receiving the reference frequency signal and producing a divided reference frequency signal, Fr.

9. The synthesizer of claim 8 further comprising:
   a phase detector coupled to the first charge pump for producing a phase error signal corresponding to a phase difference between the divided reference frequency signal, Fr, of the reference frequency divider and a divided VCO frequency signal, Fv.

10. The synthesizer of claim 9, wherein the phase error signal drives the first charge pump for generating the compensated current signal.

11. The synthesizer of claim 7, wherein the second charge pump comprises at least one current source for generating at least one magnitude of current proportional to the at least one dither control signal.

12. The synthesizer of claim 11, wherein the second charge pump includes an adder coupled to the first charge pump for dynamically adding the at least one magnitude of current to the compensated current signal to produce the dithered compensated current signal.

13. The system of claim 7, wherein the second charge pump replaces the trickle current of the first charge pump.

14. A synthesizer for a communication device, the synthesizer comprising:
   a first charge pump for generating a compensated current signal including in-band spurs within a frequency bandwidth associated with a loop filter;
   a dither generator coupled to the first charge pump and the loop filter, comprising:
      a second fractionalizer for generating at least one dither control signal based on a fractional value, F, received from a controller; and
      a second charge pump for selectively dithering the compensated current signal employing the at least one dither control signal to spread the energy of in-band spurs beyond the frequency bandwidth associated with the loop filter;
   the loop filter for attenuating the in-band spur energy associated with the dithered compensated current signal and providing a filtered signal with reduced in-band spurs to a voltage controlled oscillator (VCO); and
   an input clock divider coupled to the second fractionalizer for controlling a frequency at which the second fractionalizer operates and the frequency at which the at least one dither control signal is applied to the compensated current signal.

15. A synthesizer for a communication device, the synthesizer comprising:
   a first charge pump for generating a compensated current signal including in-band spurs within a frequency bandwidth associated with a loop filter;
   a dither generator coupled to the first charge pump and the loop filter, comprising:
      a second fractionalizer for generating at least one dither control signal based on a fractional value, F, received from a controller; and a second charge pump for selectively dithering the compensated current signal employing the at least one dither control signal to spread the energy of in-band spurs beyond the frequency bandwidth associated with the loop filter;

the loop filter for attenuating the in-band spur energy associated with the dithered compensated current signal and providing a filtered signal with reduced in-band spurs to a voltage controlled oscillator (VCO); and wherein the second fractionalizer is of a multiple accumulator type for storing an accumulator value corresponding to the fractional value, F.

16. A synthesizer for a communication device, the synthesizer comprising:

a first charge pump for generating a compensated current signal including in-band spurs within a frequency bandwidth associated with a loop filter;

a dither generator coupled to the first charge pump and the loop filter, comprising:

a second fractionalizer for generating at least one dither control signal based on a fractional value, F, received from a controller; and a second charge pump for selectively dithering the compensated current signal employing the at least one dither control signal to spread the energy of in-band spurs beyond the frequency bandwidth associated with the loop filter;

the loop filter for attenuating the in-band spur energy associated with the dithered compensated current signal and providing a filtered signal with reduced in-band spurs to a voltage controlled oscillator (VCO); and wherein the second charge pump receives a value, A, from the controller for scaling the dithered compensated current signal.

17. A fractional-N synthesizer, comprising:

a voltage controlled oscillator (VCO) generating a VCO output signal;

a loop filter coupled to the VCO;

a charge pump coupled to the loop filter, the loop filter having a pre-determined bandwidth;

a phase detector coupled to the charge pump;

a reference frequency divider coupled to the phase detector;

a reference clock source coupled to the reference frequency divider;

a VCO loop divider coupled to the VCO and phase detector;

a fractionalizer coupled to the VCO loop divider;

a dither generator coupled to the charge pump;

an input clock source coupled to the dither generator; and a controller coupled to the reference frequency divider, the fractionalizer and dither generator, the controller adjusting the dither generator, the dither generator and charge pump generating a dithered charge compensated current signal having dither of a sufficient level to spread the energy of in-band spurs to frequencies beyond the pre-determined bandwidth of the loop filter, the loop filter attenuating the energy thereby reducing the in-band spur levels in the VCO output signal.

18. The fractional-N synthesizer of claim 17, wherein the controller detects the presence of the spur and enables the dither generator to generate the dithered compensated current signal.

* * * * *

UNITED STATES PATENT AND TRADEMARK OFFICE
CERTIFICATE OF CORRECTION

| | |
|---|---|
| PATENT NO. | : 7,786,772 B2 |
| APPLICATION NO. | : 12/131035 |
| DATED | : August 31, 2010 |
| INVENTOR(S) | : Gabato, Jr. et al. |

It is certified that error appears in the above-identified patent and that said Letters Patent is hereby corrected as shown below:

In Column 3, Lines 7-8, delete "Fr and Fv." and insert -- $F_r$ and $F_v$. --, therefor.

In Column 3, Line 53, delete "Fr and Fv." and insert -- $F_r$ and $F_v$. --, therefor.

In Column 8, Line 13, in Claim 8, delete "Fr." and insert -- $F_r$. --, therefor.

In Column 8, Line 18, in Claim 9, delete "Fr," and insert -- $F_r$, --, therefor.

In Column 8, Line 19, in Claim 9, delete "Fv," and insert -- $F_v$, --, therefor.

Signed and Sealed this
Eleventh Day of September, 2012

David J. Kappos
*Director of the United States Patent and Trademark Office*